US011402437B2

(12) United States Patent
Kim et al.

(10) Patent No.: US 11,402,437 B2
(45) Date of Patent: Aug. 2, 2022

(54) REAL-TIME DETECTION/RECOVERY SYSTEM OF POWER LINE FAILURE IN POWER DISTRIBUTION SYSTEM AND CONSTRUCTION METHOD THEREFOR

(71) Applicants: NAEUN ENERGY CO., LTD., Chungju-si (KR); Na Un Kim, Yangju-si (KR)

(72) Inventors: Na Un Kim, Yangju-si (KR); In Tae Kim, Yangju-si (KR); Do Woon Kim, Yangju-si (KR)

(73) Assignees: NAEUN ENERGY CO., LTD., Chungju-si (KR); Na Un Kim, Yangju-si (KR)

( * ) Notice: Subject to any disclaimer, the term of this patent is extended or adjusted under 35 U.S.C. 154(b) by 449 days.

(21) Appl. No.: 16/477,172

(22) PCT Filed: Dec. 11, 2017

(86) PCT No.: PCT/KR2017/014469
§ 371 (c)(1),
(2) Date: Jul. 10, 2019

(87) PCT Pub. No.: WO2018/131797
PCT Pub. Date: Jul. 19, 2018

(65) Prior Publication Data
US 2019/0348216 A1 Nov. 14, 2019

(30) Foreign Application Priority Data

Jan. 11, 2017 (KR) .......................... 10-2017-0004231
Feb. 28, 2017 (KR) .......................... 10-2017-0026270
Apr. 18, 2017 (KR) .......................... 10-2017-0049489

(51) Int. Cl.
*H02H 3/00* (2006.01)
*H02H 9/08* (2006.01)
(Continued)

(52) U.S. Cl.
CPC ........... *G01R 31/58* (2020.01); *G01R 19/165* (2013.01); *H01F 27/29* (2013.01); *H01F 27/30* (2013.01);
(Continued)

(58) Field of Classification Search
CPC .......... H01F 27/34; H01F 27/29; H01F 27/40; H01F 27/30; H01F 30/12; H01H 33/02; H02H 3/04
(Continued)

(56) References Cited

U.S. PATENT DOCUMENTS

| 3,909,672 A | * | 9/1975 | Lundquist | ................ H02H 7/16 361/17 |
| 8,964,423 B2 | * | 2/2015 | Anghel | ..................... H02J 3/36 363/35 |
| 2005/0280422 A1 | * | 12/2005 | Kishibata | ............... G01R 31/52 324/522 |

FOREIGN PATENT DOCUMENTS

| JP | H10-201097 A | 7/1998 |
| KR | 10-2009-0004718 A | 1/2009 |

(Continued)

Primary Examiner — Jared Fureman
Assistant Examiner — Lucy M Thomas
(74) Attorney, Agent, or Firm — Im IP Law; Chai Im; C. Andrew Im (57) ABSTRACT

A real-time detection/recovery system of a power line failure in a power distribution system, which immediately alerts, shuts off, and recovers power in real-time when a disconnection, a resistance increase, a contact failure, a half-disconnection, or a short circuit occurs in a single-phase power supply side of a three-phase or single-phase power distribution system. A power distribution system can be provided with one or more of a power supply side detection/recovery device and a load side detection/recovery device. The power supply side and load side detection/recovery devices can recover, shut off, alert, notify, or control an (Continued)

electrical failure in a power supply line of a single-phase or three-phase power supply by forming a neutral point with an element electrically/electronically connected to the single-phase or three-phase power supply to ground the neutral point or detect a potential difference between the neutral point and the ground.

17 Claims, 8 Drawing Sheets

(51) Int. Cl.
*G01R 31/58* (2020.01)
*G01R 19/165* (2006.01)
*H01F 27/29* (2006.01)
*H01F 27/30* (2006.01)
*H01F 27/34* (2006.01)
*H01F 27/40* (2006.01)
*H01F 30/12* (2006.01)
*H01H 33/02* (2006.01)
*H02H 3/04* (2006.01)

(52) U.S. Cl.
CPC ............. *H01F 27/34* (2013.01); *H01F 27/40* (2013.01); *H01F 30/12* (2013.01); *H01H 33/02* (2013.01); *H02H 3/04* (2013.01)

(58) Field of Classification Search
USPC .......................................................... 361/47
See application file for complete search history.

(56) References Cited

FOREIGN PATENT DOCUMENTS

| | | |
|---|---|---|
| KR | 10-1109024 B1 | 2/2012 |
| KR | 10-1302806 B1 | 9/2013 |
| KR | 10-1320373 B1 | 10/2013 |
| KR | 10-2015-0013105 A | 2/2015 |
| KR | 10-2015-0134563 A | 12/2015 |
| KR | 10-2016-0092788 A | 8/2016 |

* cited by examiner

REAL-TIME DETECTION/RECOVERY SYSTEM OF POWER LINE FAILURE IN POWER DISTRIBUTION SYSTEM AND CONSTRUCTION METHOD THEREFOR

RELATED APPLICATIONS

This application is a § 371 application of PCT/KR2017/014469 filed Dec. 11, 2017, which claims priority from Korean Patent Application Nos. 10-2017-0004231 filed Jan. 11, 2017, 10-2017-0026270 filed Feb. 28, 2017 and 10-2017-0049489 filed Apr. 18, 2017, each of which is incorporated herein by reference in its entirety.

TECHNICAL FIELD

The present invention relates to a real-time detection/recovery system in case of a power line failure in a power distribution system and a construction method thereof, which detect an electrical failure such as a disconnection, an electric leakage, a partial disconnection, a resistance increase, a loose contact or the like in real-time when the electrical failure occurs in a power line of a three-phase or single-phase power distribution system, and shut down power, issue an alert or recover power outage in real-time by generating an electrical signal based on the electrical failure.

BACKGROUND OF THE INVENTION

Figure 1:
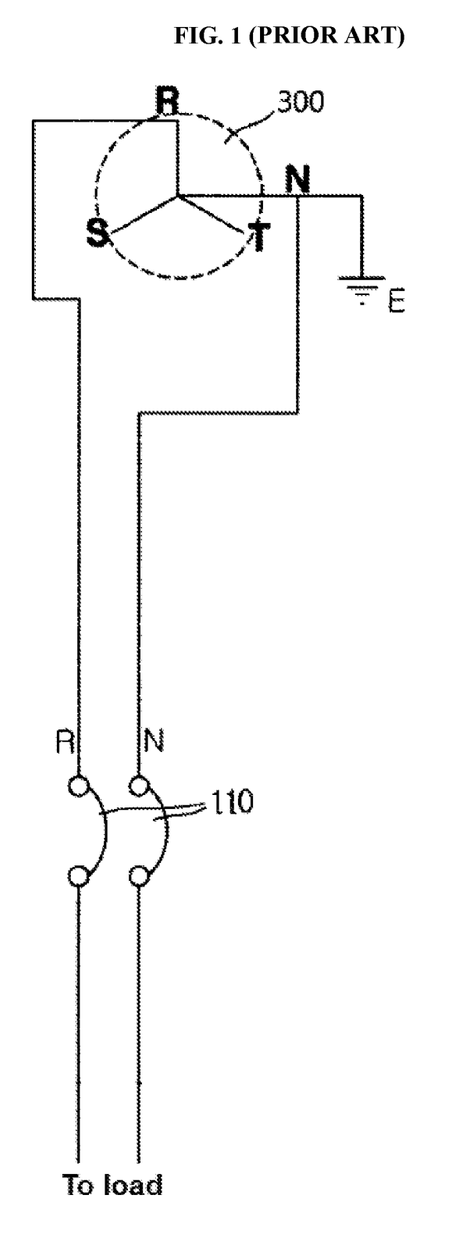
FIG. 1 is a view showing the configuration of an existing single-phase two-wire power distribution line.

The power distribution system of FIG. 1 shows an example of a three-phase four-wire power distribution system. A main voltage transformer 300 configured of an R phase, an S phase and a T phase generally connects a neutral line N and power lines (R phase, S phase and T phase) in a method such as a Y connection, a delta connect and a Y-delta connection and supplies power to the load. At this point, if a load is connected between a power line and another power line, 380V is supplied to the load, and if a load is connected between a power line (e.g., R phase) and the neutral line N, 220V is supplied to the load.

Here, the neutral line N indicates a line which commonly processes a line on one side of each phase in a multi-phase multi-wire line. Although six strands of electric wires are needed in principle to use three phases, if the lines on one sides are commonly processed by shifting the phases of single-phase two-wire lines as much as 120° respectively, the wires are reduced to four strands, and the potential of the commonly processed point becomes zero by vector sum. The zero potential (null potential) like this becomes a reference potential, which becomes the so-called N phase, i.e., the neutral line. Although the neutral line should have a null potential, i.e., a ground potential, in principle, it may have a small voltage when the phase of each of the RST phases does not actually become exactly 120° in the field. At this point, if the neutral line is commonly connected to the earth line, which is a ground potential line, to prevent rise of the potential of the neutral line, the null potential is maintained although there is a small difference in the phase of each of the RST phases as the neutral line contacts with the earth.

Two connected wires are used in a single-phase electric line, and since one of the two wires is connected to the neutral line, which has a potential equal to that of the earth, and the other wire is connected to a power line having a potential difference of 220V with the earth, if an electric leakage (grounding) occurs in the power line, the risk of death by electric shock or outbreak of a fire is very high.

In addition, if the neutral line on the power supply side, to which a single-phase load is commonly connected, is disconnected or poorly connected, an abnormal voltage flows into the load due to unbalanced loads different from each other through the neutral line commonly connected to an unbalanced single-phase load connected to a different phase of the three phases, and thus overheat burning damage of an electric device and outbreak of a fire caused by the overheat frequently occur. Therefore, a power shutdown device 110 such as a circuit breaker for electric wiring and/or an electric leakage breaker is installed to prevent the accident.

The circuit breaker for electric wiring (or a molded case circuit breaker) used in the power shutdown device 110 is accommodated in a molded case to be protected from overload or short circuit of current flowing through the wiring, which is used to protect the wires in a circuit of low indoor voltage of AC 600V or lower or DC 250V or lower. Generally, the circuit breaker for electric wiring is also referred to as a molded case circuit breaker (MCCB).

In addition, the electric leakage breaker used in the power shutdown device 110 is device for preventing electric shock by sensing a leakage current of about 5 to 30 mA. Most of fuses or circuit breakers for electric wiring operate at a high current of about a few amperes (A). Accordingly, an electric leakage breaker should be used to prevent accidents of electric shock caused by a small leakage current, and the electric leakage breaker senses a leakage current of about 5 to 30 mA and shuts down the circuit in less than 25 to 40 msec to prevent the electric shock from reaching the heart of a victim and leading to a death. The leakage current which becomes the reference of shutdown varies depending on the country and region, and in Korea, it is limited to one-two thousandth of a rated current. For example, if the rate current of an electric leakage breaker is 100 A, its leakage current is 50 mA or lower.

A general electric leakage breaker measures a difference between a current outgoing to the power line and a current incoming into the neutral line. If the sum of the outgoing current and the incoming current is not zero, it means that the current leaks somewhere. At this point, the electric leakage breaker operates and cuts off the leakage current. Like this, the electric leakage breaker is in a complementary relation with a fuse or a circuit breaker for electric wiring which cuts off high current. Since overload or short circuit cannot be prevented using only a circuit breaker dedicated to electric leakage, a circuit breaker for cutting off both over-current (short circuit) and electric leakage is used in most cases.

In addition, an electric leakage breaker of a special purpose for cutting off a leakage current of 500 mA or higher is installed in an environment of a data center or the like in which a general electric leakage breaker having a low cutoff current specification misses blocking of the current and operates to cause an accident. Such an electric leakage breaker of a special purpose is installed for fire protection.

Techniques conventionally proposed to solve the problems generated due to a loose contact or a disconnection are disclosed in Korean Laid-opened Patent No. 10-2009-0004718 (Laid-opened on Jan. 12, 2009) (Title of invention: Apparatus and method for detecting loose contact) (Hereinafter, referred to as 'conventional technique 1'), Korean Patent Registration No. 10-1109024 (Registered on Feb. 20, 2012) (Title of invention: Apparatus and method for detecting loose contact of watt hour meter) (Hereinafter, referred to as 'conventional technique 2'), and Korean Patent Registration No. 10-1320373 (Registered on Oct. 23, 2013)

(Title of invention: Open-phase recovery device equipped with a transformer and its installation method) (Hereinafter, referred to as 'conventional technique 3').

The disclosed 'conventional technique 1' may protect a user from the risk of fire by sensing a loose contact using changes in current effective value, power factor, current instantaneous value, harmonic waves or the like as an index and accordingly shutting down the power. Since the loose contact is determined when two or more factors are satisfied among the five factors capable of sensing a loose contact, a loose contact is sensed more correctly. Furthermore, it is configured to inform a user terminal of information on a power shutdown situation according to the loose contact so that a user at a remote site may easily recognize.

The 'conventional technique 2' includes a voltage and current detection unit for detecting a voltage and a current supplied to a customer; a power factor calculation unit for calculating a power factor value for a total measurement time and by the unit of a predetermined measurement time through the detected voltage and current values; a loose contact determination unit for determining a loose contact when the power factor value calculated for a total measurement time and by the unit of a predetermined measurement time continuously decreases in a range of a value smaller than a predetermined reference value; and an interface unit for transmitting a loose contact signal to a remote server when a loose contact is determined by the loose contact determination unit, and it is configured to prevent burning damage of an electric device (electric meter) caused by the loose contact by preventing the loose contact of a watt hour meter.

The 'conventional technique 3' is configured to detect open phase of a power line, disconnection of the neutral line, and unbalanced abnormal current generated in the power line and the neutral line in a three-phase four-wire power distribution system, and maintain normal power by recovering the open phase of the power line, the disconnection of the neutral line, and power unbalance to normal and decreasing image harmonic waves.

OBJECT AND SUMMARY OF THE INVENTION

Technical Problem

However, the conventional techniques as described above have a problem in that an abnormal voltage, an electric shock, a power outage, a fire or the like occurs as an electrical failure cannot not be electronically or electrically detected, cut off, alerted and recovered when the electrical failure occurs due to a disconnection, a loose contact, a partial disconnection, a resistance increase, an electric leakage or the like on the power supply side supplied with power from a three-phase four-wire (R, S, T, N) or single-phase two-wire (RN, SN, TN) power distribution system.

In addition, there is a problem in that an electric shock caused by an electric leakage on the power supply side, a power outage caused by a disconnection, overheat and outbreak of a fire caused by a loose contact or a partial disconnection cannot be alerted, cut off or recovered since there is no way of detecting, cutting off, alerting or recovering an electrical failure when the electrical failure occurs due to a disconnection (R1, N or R2), a resistance increase, a loose contact, a partial disconnection, an electric leakage or the like on the power supply side of an existing single-phase three-wire power distribution system.

In addition, there is a problem in that if a disconnection occurs in the line on the power supply side, control functions of traffic lights, street lamps, firefighting facilities, drainage pump stations and the like are paralyzed, and a functional failure occurs in a switch that automatically opens and closes when an error occurs in the power line, and this is expanded to a major accident.

In addition, there is a problem in that when an electric leakage occurs in the power line as the potential difference between the single-phase power and the earth is as high as 220V, an electric shock or a fire occurs, resulting in loss of life and property.

Accordingly, it is required to provide a real-time detection/recovery system in case of a power line failure in a power distribution system, which immediately alerts, cuts off and recovers in real-time when a disconnection, a resistance increase, a loose contact, a partial disconnection, an electric leakage or the like occurs on the power supply side of a three-phase or single-phase power distribution system. Therefore, to solve the problems generated in the conventional power distribution systems as described above, the present invention provides a real-time detection/recovery system in case of a power line failure in a power distribution system and a construction method thereof, which prevents generation of an accident such as power outage, electric shock, burning damage of a device, fire, overheat, functional paralysis of a switch or the like by immediately alerting, cutting off, and recovering an electrical failure in real-time when a disconnection, a resistance increase, a loose contact, a partial disconnection, an electric leakage or the like occurs in the line of power supplied from a three-phase four-wire (R, S, T, N) or single-phase two-wire (RN, SN, TN) power distribution system.

Technical Solution

To accomplish the above objects, according to one aspect of the present invention, a system for preventing a power outage, an electric shock or a fire accident caused by a disconnection, a resistance increase, a loose contact, a partial disconnection or an electric leakage in a power distribution system may be provided with one or more of a power supply side detection/recovery device and a load side detection/recovery device in the power distribution system.

The power supply side and load side detection/recovery devices perform any one or more among recovery, cutoff, alert, notification and control in case of an open phase, a disconnection, a loose contact or a resistance increase in a power supply line of a single-phase or three-phase power supply by forming a neutral point using an element electrically/electronically connected to the single-phase or three-phase power supply, and grounding the neutral point to the earth or detecting a potential difference between the neutral point and the earth.

Here, the element is any one or more selected among an inductor, a resistor, a capacitor, a varistor, silicon or germanium, carbon, a coil, and an integrated circuit.

In an embodiment of the present invention, the power supply side detection/recovery device may perform any one or more among recovery, cutoff, alert, notification and control in case of an open phase, a disconnection, a loose contact or a resistance increase in a power supply line of a single-phase or three-phase power supply by configuring a neutral point in the middle (center tap) of a power output coil, and grounding the neutral point to the earth or detecting a potential difference between the neutral point and the earth, and the load side detection/recovery device may perform any one or more among recovery, cutoff, alert, notification and control in case of an open phase, a disconnection, a loose contact or a resistance increase in the power supply line of the single-phase or three-phase power supply by configuring a neutral point in the middle of the power output coil, and grounding the neutral point to the earth, connecting the neutral point to the neutral point of the power supply side detection/recovery device, or detecting a potential difference between the neutral point and the earth.

Meanwhile, in another embodiment of the present invention, the power supply side detection/recovery device may include a primary coil and may be provided with a first leg, a second leg and a third leg, which configure an iron core, and a first wire, a second wire and a third wire, which configure a secondary coil. Here, the second leg is used as a passage of magnetic flux of two phases, the first wire is wound around the first leg, the second wire is wound around the third leg, the third wire is wound around the first leg and the third leg in a zigzag form in a direction opposite to the direction of winding the first wire and the second wire, one ends of the first wire, the second wire and the third wire are connected to the neutral line, and an intermediate tap for supplying single-phase power may be included in the middle the first wire, the second wire or the third wire connected to the neutral line.

In still another embodiment of the present invention, although the R phase, the S phase, the T phase or the neutral line N is disconnected or open-phased on the power supply side due to lightning strike, short circuit, grounding, burning damage of equipment and materials or fuse disconnection in the power distribution system, the power supply side detection/recovery device may prevent outage of single-phase power by recovering the electrical failure and supplying single-phase power in real-time, and prevent an electric shock or outbreak of a fire caused by an electric leakage (grounding) by reducing the ground potential difference of the single-phase power.

In still another embodiment of the present invention, occurrence of an electric shock or a fire accident caused by generation of an electric leakage can be prevented by grounding the neutral point of the power supply side detection/recovery device to the earth and maintaining the potential difference between the power supply line and the earth at a predetermined potential (e.g., 110V).

In still another embodiment of the present invention, the power supply side detection/recovery device may be connected to a three-phase four-wire or single-phase three-wire power distribution system to prevent inflow of unbalanced overvoltage when the neutral line is disconnected in the power distribution system and fundamentally prevent overheat and fire caused by the unbalanced overvoltage.

In still another embodiment of the present invention, the power supply side detection/recovery device may be connected to a three-phase or three-phase four-wire power distribution system to fundamentally prevent outage of single-phase power caused by an electrical failure by recovering three-phase power in real-time and supplying single-phase power to the load side without power outage even in the case of fuse disconnection of a phase, damage and disconnection of a line, failure of a transformer, burning damage of equipment and materials, open phase, and disconnection of the neutral line on the power supply side.

Meanwhile, in an embodiment of the present invention, prevention of a short circuit accident caused by a line, reduction of electric leakage, reduction of line failure, simplicity of line maintenance, and reduction of construction cost can be accomplished by grounding the neutral point of the load side detection/recovery device to the earth and configuring single-phase power supply lines as one line.

In another embodiment of the present invention, the neutral point of the load side detection/recovery device is connected to the neutral point of the power supply side detection/recovery device, and if an electrical failure occurs due to occurrence of a disconnection, a loose contact, a partial disconnection or an electric leakage (grounding) on the power supply side of the load side detection/recovery device, the power line or the neutral point of the load side detection/recovery device may generate and transfer an electrical signal to a fault detector (described below).

Meanwhile, the fault detector detects an electrical signal generated when a fault occurs in the power line or the neutral point provided in the input and output lines of the load side detection/recovery device, and if it is detected as occurrence of a disconnection, a loose contact, a partial disconnection or an electric leakage (grounding), the fault detector may alert through an alert generator, cut off the fault through a circuit breaker, or recover the fault in real-time through the load side detection/recovery device.

An electronic relay (solid state relay (SSR)), a zero current transformer, a voltage detector, a current detector or a relay may be used as the fault detector to detect a failure occurrence electrical signal outputted from the neutral point or the power line.

In addition, according to another aspect of the present invention, there is provided a real-time detection/recovery system in case of a power line failure in a power distribution system, the detection/recovery system including: a power supply side detection/recovery device provided with a first neutral point to reduce the potential difference with the earth to be lower than an existing potential difference by grounding the neutral point to the earth; a load side detection/recovery device provided with a second neutral point to recover an electrical failure on the power supply side in real-time by grounding the neutral point to the earth or connecting the neutral point to the neutral point of the power supply side detection/recovery device; a fault detector for detecting input and output current of the power line or the neutral point of the load side detection/recovery device or detecting the neutral point and ground voltage to alert or cut off a failure or transfer a detected failure detection value to a controller; the controller for comparing the detection value provided by the fault detector with a set value, issuing an alert, shutting down the power or transferring the fault to a communication module to inform over a wired or wireless connection if it is determined as a fault, and cancelling the alert when an alert cancellation signal is received; an alert generator for generating an alert according to the alert signal received from the fault detector or the controller; an alert cancellation input unit for cancelling issuance of alert of the alert generator; and a circuit breaker for shutting down failed power according to a shutdown signal of the fault detector or the controller.

According to another aspect of the present invention, there is provided a construction method of a real-time detection/recovery system in case of a power line failure in a power distribution system, the method including the steps of: installing a power supply side detection/recovery device or a load side detection/recovery device in an existing three-phase or single-phase power distribution system; connecting the neutral point of the power supply side detection/recovery device to the earth or the neutral point of the load side detection/recovery device, or installing a detector to detect potentials of the neutral point of the power supply side detection/recovery device and the earth; connecting the neutral point of the load side detection/recovery device to the earth or the neutral point of the power supply side detection/recovery device, or installing a fault detector to detect potentials of the neutral point of the load side detection/recovery device and the earth; connecting a wire of an output coil of the power supply side detection/recovery device to a load, or electrically connecting the wire of the output coil of the power supply side detection/recovery device to a wire of an input coil of the load side detection/recovery device; and performing any one or more among recovery, cutoff, alert, notification and control in case of an open phase, a disconnection, a loose contact or a resistance increase in the power supply side detection/recovery device and power supply facility or in the power supply facilities of a single-phase or three-phase power supply of the power supply side detection/recovery device and the load side detection/recovery device, by electrically connecting a wire on the input power supply side of the power supply side detection/recovery device to a three-phase or single-phase power line of an existing power distribution system.

Advantageous Effects

According to the present invention, when the power supply side supplied with power from a single-phase two-wire, single-phase three-wire or three-phase four-wire power distribution system is disconnected, occurrence of various accidents caused by power outage can be prevented if the power outage is prevented by recovering normal power in real-time. Therefore, occurrence of a fatal accident caused by an electric shock, burning damage of an electrical device, an electrical fire or the like caused by a disconnection, a loose contact, an electric leakage, a partial disconnection or the like can be prevented.

In addition, in a single-phase (two-wire of three-wire) or three-phase (three-wire of four-wire) power distribution system, since an electrical failure caused by an electric leakage, a disconnection, a loose contact, a partial disconnection, a resistance increase or the like on the power supply side is promptly corrected by immediately cutting off or notifying (alerting) the failure in real-time, expansion of an accident can be prevented.

In addition, in a single-phase power distribution system provided in a three-phase four-wire power distribution system, occurrence of an electric shock and a fire accident caused by an electric leakage (grounding), as well as an accident caused by the neutral line such as a disconnection, image harmonics or the like generated due to the neutral line, can be prevented by reducing the potential of the single-phase power line to the earth.

BRIEF DESCRIPTION OF THE DRAWINGS

Vector diagram 241-$a$ is a phase vector diagram when the power supply side detection/recovery device 240 is in a normal state.

Vector diagram 242-$b$ is a recovery sequence vector diagram when S phase of input power is disconnected or open phased.

Vector diagram 242-$a$ is a recovery sequence vector diagram when R phase of input power is disconnected or open phased.

Vector diagram 242-$b$ is a recovery sequence vector diagram when T phase of input power is disconnected or open phased.

DETAILED DESCRIPTION OF THE EMBODIMENTS

A 'real-time detection/recovery system in case of a power line failure in a power distribution system' according to the present invention includes: a power supply side detection/recovery device provided with a neutral point to reduce the potential difference with the earth to be lower than an existing potential difference by grounding the neutral point to the earth; a load side detection/recovery device provided with a neutral point to recover an electrical failure on the power supply side in real-time by grounding the neutral point to the earth or connecting the neutral point to the neutral point of the power supply side detection/recovery device; a fault detector for detecting input and output current of the power line or the neutral point of the load side detection/recovery device or detecting the neutral point and ground voltage to alert or cut off a failure or transfer a detected failure detection value to a controller; the controller for comparing the detection value provided by the fault detector with a set value, issuing an alert, shutting down the power or transferring the fault to a communication module to inform over a wired or wireless connection if it is determined as a fault, and cancelling the alert when an alert cancellation signal is received; an alert generator for generating an alert according to the alert signal received from the fault detector or the controller; an alert cancellation input unit for cancelling issuance of alert of the alert generator; and a circuit breaker for shutting down failed power according to a shutdown signal of the fault detector or the controller. This will be described in more detail with reference to the drawings.

Figure 2:
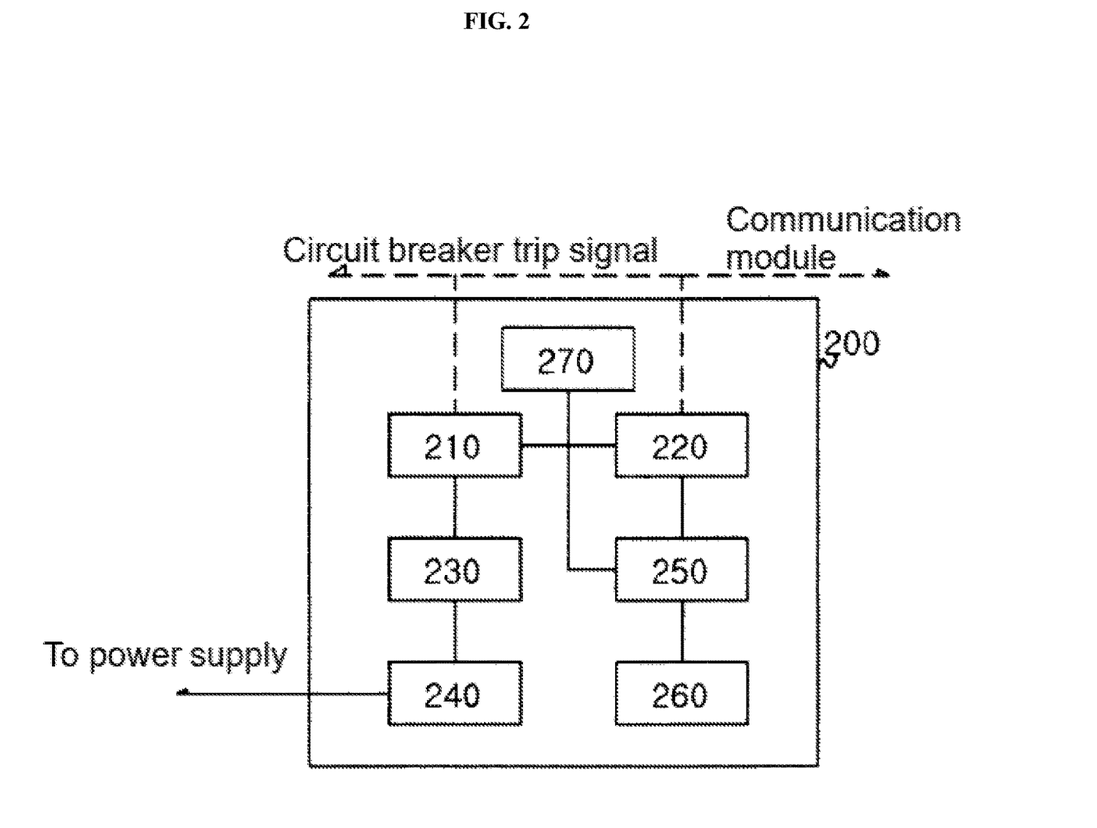
FIG. 2 is a view showing the configuration of a real-time detection/recovery system 200 in case of a power line failure in a power distribution system of the present invention.

FIG. 2 is a view showing the configuration of a real-time detection/recovery system 200 in case of a power line failure in a power distribution system according to a preferred embodiment of the present invention and includes constitutional components described below.

A power supply side detection/recovery device 240 connected to a main voltage transformer (e.g., 300 in FIG. 1) provided in an existing single-phase or multi-phase multi-wire (e.g., single-phase (two-wire or three-wire), three-phase (three-wire or four-wire), etc.) power distribution system (e.g., FIG. 1). The power supply side detection/recovery device 240 includes therein a neutral point (first neutral point) grounded to the earth and performs a function of reducing the potential difference with the earth to be lower than an existing potential difference.

A load side detection/recovery device 230 connected to the line on the load side of the power distribution system. The load side detection/recovery device 230 includes therein another neutral point (second neutral point) and recovers an electrical failure on the power supply side in real-time by grounding the second neutral point to the earth or connecting the second neutral point to the first neutral point of the power supply side detection/recovery device.

A fault detector 210 for detecting occurrence of a disconnection, a resistance increase, a loose contact, a partial disconnection or an electric leakage in association with the load side detection/recovery device 230. The fault detector 210 detects a fault by detecting input and output current of the power line or the second neutral point of the load side detection/recovery device or detecting voltage of the second neutral point and transfers a detected fault detection value to the controller.

An alert generator 250 for alerting generation of a fault detected by the fault detector 210 or determined by the controller described below as a visual and/or auditory alert.

An alert cancellation input unit 260 for receiving a signal for cancelling a generated alert (e.g., when an alert cancelling switch is handled) and generating an alert cancellation signal.

A circuit breaker 270 for shutting down the power supply side and the load side of a power distribution system according to generation of a fault detected by the fault detector 210 or according to a shutdown signal of the controller.

A controller 220 for determining a fault of the power distribution system from the output of the fault detector 210, outputting an alert or a shutdown signal for operating the alert generator 250 or the circuit breaker 270, and informing an external manager of the fault using a communication module over a wired or wireless connection.

Figure 3:
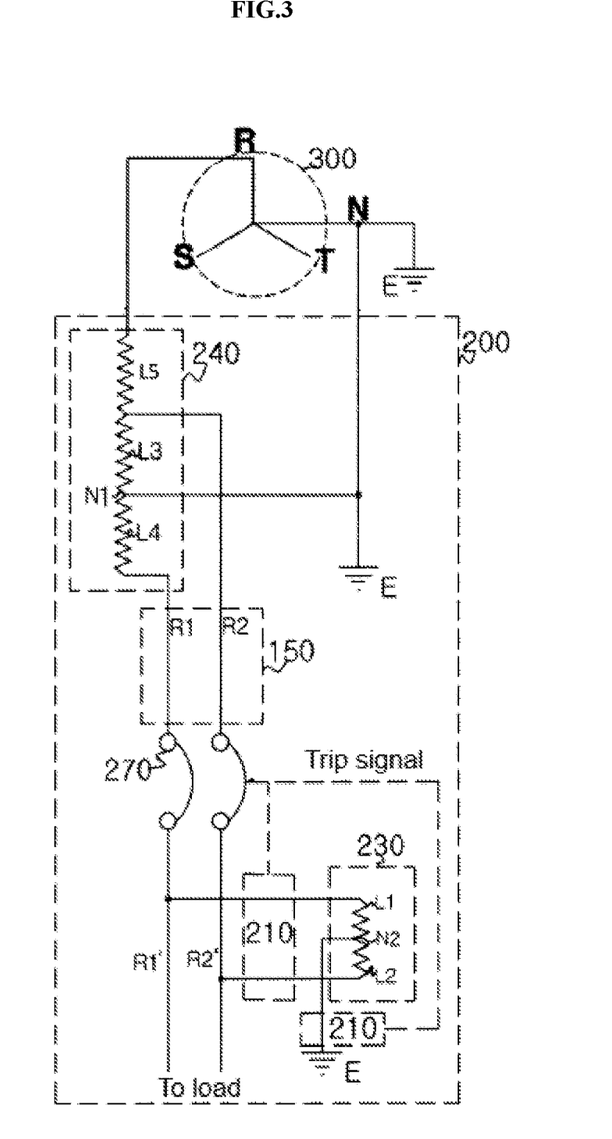
FIG. 3 is a circuit diagram showing the embodiment of FIG. 2 in the case of single-phase two-wire input power.
Figure 4:
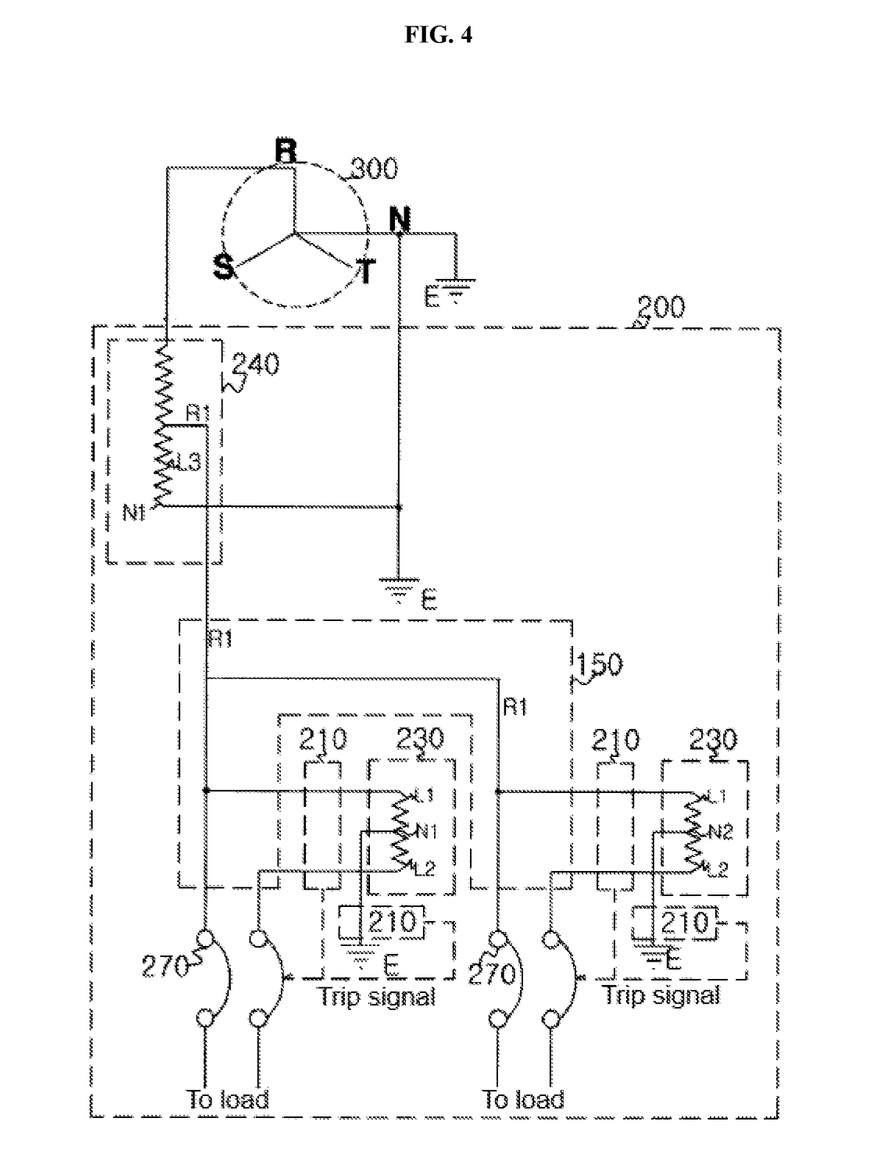
FIG. 4 is a modified embodiment of FIG. 3, which is a circuit diagram of the embodiment of FIG. 2 when the line of the recovery power distribution system 150 is configured as one line.
Figure 5:
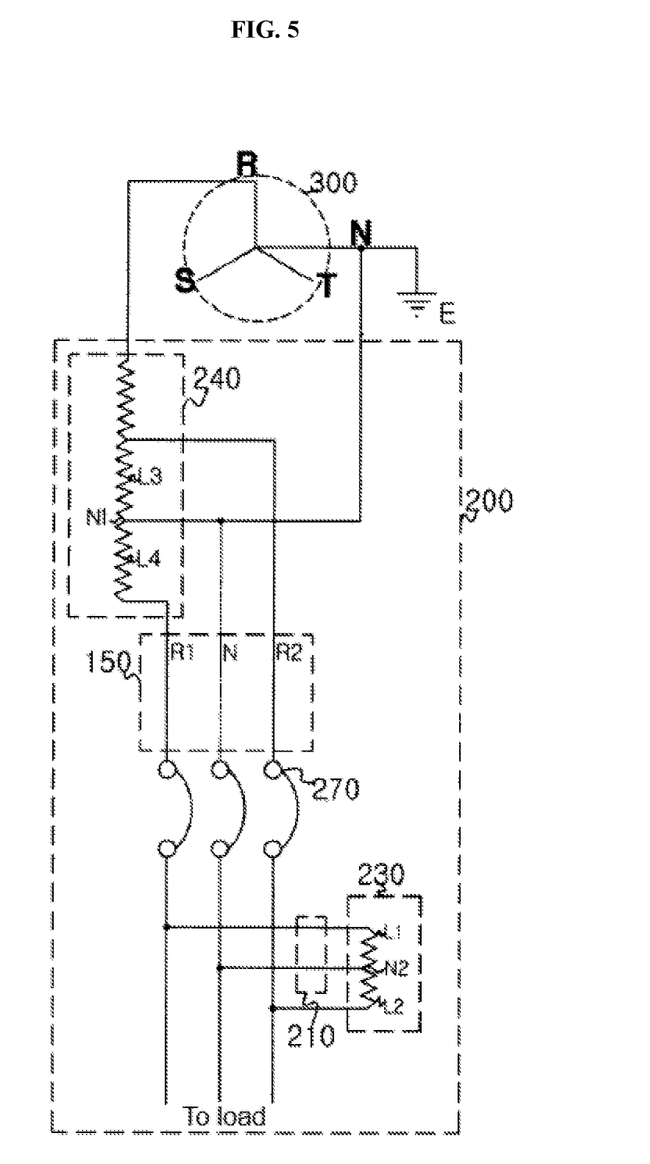
FIG. 5 is a circuit diagram showing the embodiment of FIG. 2 in the case of single-phase three-wire input power.
Figure 6:
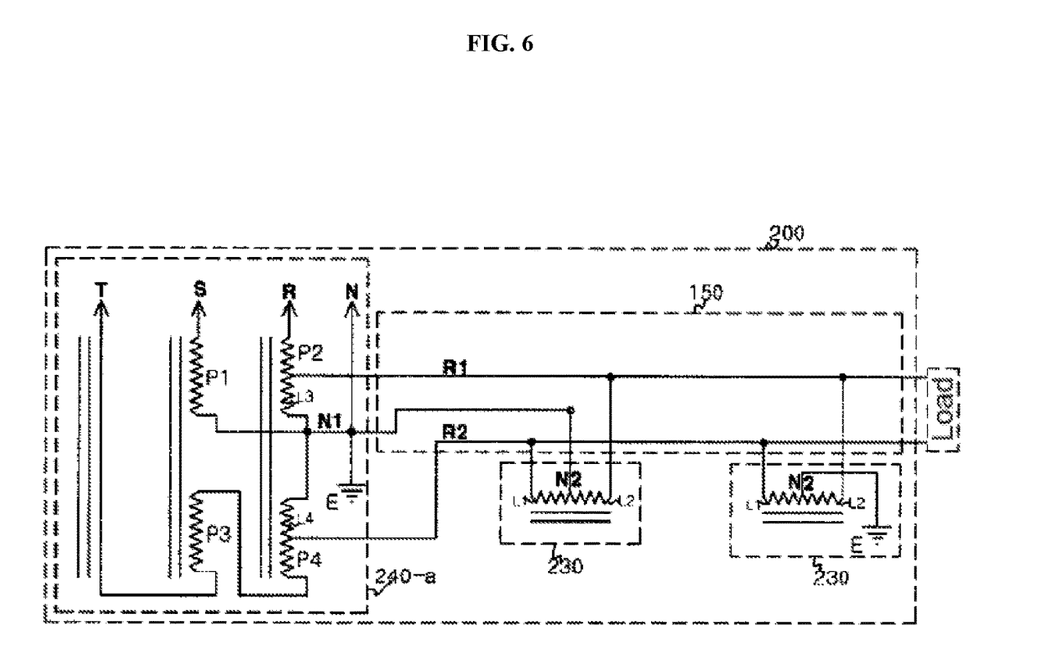
FIG. 6 is a view showing the configuration of a construction method of a real-time detection/recovery system 200 in case of a power line failure in a power distribution system according to the circuit diagram of FIG. 2 and a preferred embodiment of the present invention in the case of three-phase four-wire input power.

Hereinafter, details of each constitutional component of FIG. 2 will be described through specific embodiments with reference to FIGS. 3 to 6. FIG. 3 is a circuit diagram showing an embodiment of a real-time detection/recovery system 200 in case of a power line failure in a single-phase power distribution system, which is the embodiment of FIG. 2 in the case of single-phase two-wire input power. FIG. 4 is a modified embodiment of FIG. 3 of a single-phase two-wire power supply, which is a circuit diagram of the embodiment of FIG. 2 when the line of the recovery power distribution system 150 is configured as one line. FIG. 5 is a circuit diagram showing the embodiment of FIG. 2 in the case of single-phase three-wire input power. FIG. 6 is a circuit diagram showing the embodiment of FIG. 2 in the case of three-phase four-wire input power.

The power supply side detection/recovery device 240 is connected to the power supply side to be supplied with power from a main voltage transformer (e.g., 300 of FIG. 1) of a power distribution system (e.g., FIG. 1) and has therein a neutral point (first neutral point, N1) grounded to the earth to perform a function of reducing the potential difference with the earth to be lower than an existing potential difference.

As a specific example, in FIG. 3, the power supply side detection/recovery device 240 is configured of a primary coil L5 connected to the output of the R phase single-phase power of the main voltage transformer 300 and two secondary coils L3 and L4 connected to the primary coil L5 in series. A first neutral point N is formed and grounded between the two secondary coils L3 and L4 connected in series. The secondary coils L3 and L4 are actually formed as one coil, and a center tap formed therebetween may be grounded as the first neutral point N. In the power supply side detection/recovery device 240 of the embodiment of FIG. 3, a recovery power distribution system 150 is configured as a load power supply line R2 comes out from the connection point between L5 of the primary coil and L3 of the secondary coil and another load power supply line R1 comes out from an end portion of L4 of another secondary coil connected to L3 of the secondary coil.

In addition, in FIG. 4, the power supply side detection/recovery device 240 is configured of a primary coil L5 connected to the output of the R phase single-phase power of the main voltage transformer 300 and a secondary coil L3 connected to the primary coil L5 in series. An end portion of the secondary coil L3 connected in series is configured and grounded as the first neutral point N1. A load power supply line R1 comes out from the connection point between the primary coil L5 and the secondary coil L3 and configures a recovery power distribution system 150.

In addition, in an embodiment of the single-phase three-wire input power of FIG. 5, the configuration of the power supply side detection/recovery device 240 is the same as shown in FIG. 3. However, N1 is not grounded by itself, and it comes out as a third load power supply line N and configures a recovery power distribution system 150, together with the other two load power supply lines R1 and R2.

Meanwhile, a power supply side detection/recovery device 240-a in the case of a three-phase four-wire input power is configured as shown in FIG. 6, in which three load power supply lines R1, R2 and N come out and configure a recovery power distribution system 150.

Integrally describing the power supply side detection/recovery device 240 in detail, if the power supply voltage of an existing three-phase four-wire (R, S, T, N) of single-phase (R-N, S-N, T-N) power distribution system is 220V, the potential difference with the earth is 220V. Here, the primary coil of the power supply side detection/recovery device 240 (or 240-a of FIGS. 6 to 8) is supplied with power of three-phase 380V or single-phase 220V. The secondary coil is wound according to a transformation ratio to transform a supplied power into a power that will be actually used. An intermediate tap or a first neutral point N1 is configured in the middle of the wire of the secondary coil, and the neutral point N1 is grounded to the earth E to secure a power line of the recovery power distribution system 150, and the potential of the supply power with the earth is reduced to 110V. Here, the transformation ratio of the wires L3 and L4 of the secondary coil of the power supply side detection/recovery device 240 (or 240-a) is preferably set to 1:1.

The power supply side detection/recovery device 240 like this may reduce the risk of electric shock even in case of an electric leakage (grounding) by reducing the potential of the single-phase supply power to 110V and fundamentally prevent generation of abnormal voltage flowing in by an unbalanced load due to disconnection of the neutral line, by excluding the neutral line commonly used in a power distribution system having an unbalanced single-phase load. Consequently, reliability of the recovery power distribution system 150 can be secured, and particularly, as single-phase three-wire power can be recovered in real-time although the neutral line is disconnected, electric accidents caused by the neutral line can be fundamentally prevented through the load side detection/recovery device 230.

Next, the load side detection/recovery device 230 connected on the load side will be described.

In FIG. 3, the load side detection/recovery device 230 has a configuration of forming and grounding a second neutral point N2 at the connection points of coils L1 and L2 (or a center tap of one coil L1-L2 connected to two lines) respectively connected to two lines R1' and R2' supplied to the load to input and output single-phase power.

Although the load side detection/recovery device 230 of FIG. 4 is similar to the load side detection/recovery device 230 of FIG. 3 in configuration, it is different in that the load side detection/recovery device 230 is connected to the recovery power distribution system 150 before the circuit breaker 270. In addition, in FIG. 4, one or more of the load side detection/recovery devices 230 are connected in parallel to perform a kind of redundancy function.

In FIG. 5, the load side detection/recovery device 230 is connected to two load power supply lines R1' and R2' connected after the circuit breaker 270 as shown in FIG. 3, and the second neutral point N2 thereof is connected to a third load power supply line N'.

In addition, in FIG. 6, two load side detection/recovery devices 230 are located after the circuit breaker 270, and the second neutral point N2 of the one on the left side is electrically connected to the first neutral point N1 of the power supply side detection/recovery device 240-*a* in a way similar to that of FIG. 5, and the second neutral point N2 of the other one on the right side is grounded in a way similar to that of FIG. 4.

Next, the fault detector 210 detects current flowing through the coil L1-L2 of the load side detection/recovery device 230 or voltage between two end points thereof using a current/voltage detector or detects current between the second neutral point N2 and the earth E. In this case, the controller (220 of FIG. 2) determines whether a fault has occurred by comparing a detection value detected by the fault detector 210 and a preset value, and if it is determined that a fault has occurred, the controller 220 outputs a trip signal to the circuit breaker 270. The trip signal may be designed to be outputted from the fault detector 210 or the controller 220 as shown in FIG. 2.

Meanwhile, as another embodiment, if the fault detector 210 is implemented as a non-contact relay (SSR), disconnection of the power line may be detected, and the controller 220 may determine the disconnection and output an alert or shutdown signal.

Now, the operation of a real-time detection/recovery system 200 in case of a power line failure in a single-phase power distribution system will be described in detail for each of the embodiments shown in FIGS. 3 to 5.

The power supply side detection/recovery device 240 is configured of a coil and an iron core for transforming and outputting a voltage of single-phase power. As a first neutral point N1 is formed in the middle of the wire of the output coil and grounded to the earth E, the potential difference of the single-phase two-wire power outputted and supplied from the power supply side detection/recovery device 240 is reduced by half compared with existing supply power, and an electric shock or a fire accident caused by grounding (electric leakage) is greatly reduced. In addition, since a neutral line N of a general power distribution system commonly used in a general single-phase load is not used, inflow of abnormal voltage by the neutral line is fundamentally prevented, and the risk of fire caused by disconnection of the neutral line is fundamentally prevented, and thus it performs a function of protecting life and property from an electrical fire (however, although a neutral line is used in the single-phase three-wire power supply of FIG. 5 and the neutral line is disconnected, power is immediately recovered on the load side, and abnormal voltage does not occur).

The real-time detection/recovery system 200 in case of a power line failure in a single-phase power distribution system like this includes a load side detection/recovery device 230 in the electric line on the load side of the power distribution line of the recovery power distribution system 150. A second neutral point N2 is configured in the input or output coil of the load side detection/recovery device 230 to recover, cut off, alert and inform a fault when the fault occurs in the line of power supplied from the power supply side detection/recovery device 240, and the second neutral point N2 is grounded to the earth E or electrically connected to the first neutral point N1 provided in the power supply side detection/recovery device 240. Therefore, when a disconnection, a loose contact or a partial disconnection occurs in a single-phase two-wire or single-phase three-wire power supply, they are recovered in real-time. Alternately, when a disconnection, a resistance increase, a loose contact, a partial disconnection or an electric leakage occurs, the fault detector 210 may detect generation of failed voltage or flow of failed current from the power line or the neutral point.

In addition, the second neutral point N2 of the load side detection/recovery device 230 electrically connected to the first neutral point N1 of the power supply side detection/recovery device 240 becomes a neutral line in a single-phase three-wire power supply and immediately alerts, cuts off or recovers when a disconnection occurs on the power supply side of the single-phase three-wire power supply. If the second neutral point N2 electrically connected to the first neutral point N1 is also used in a single-phase two-wire power supply, it functions as a reserved line when a disconnection occurs in the power line, and short-circuit current is distributed when the line is short-circuited on the load side, and thus reliability of the system can be enhanced.

Meanwhile, describing the load side detection/recovery device 230, the load side detection/recovery device 230 also has a second neutral point N2 formed in the middle of the input and output coil of the supply power, and the second neutral point N2 is grounded to the earth or connected to the first neutral point N1 of the power supply side detection/recovery device 240. Therefore, if an unbalance occurs in an electric line R1, R2 or the like of the recovery power distribution system 150 as a disconnection, a resistance increase, a loose contact, a partial disconnection or an electric leakage occurs in the electric line, the load side detection/recovery device 230 operates using the second neutral point N2 to recover, alert or cut off the unbalance in real-time.

Here, describing the recovery process when R1 of the single-phase two-wire power supply is disconnected in the electric line, if electric line R1 is disconnected on the power supply side, only one electric line R2 remains, and the electric line R2 supplies power to the coil L2 of the load side detection/recovery device 230. This coil L2 recovers the single-phase two-wire power by electromagnetically inducing the coil L1 in association with the earth E to which the second neutral point N2 of the load side detection/recovery device 230 is connected. If electric line R2 is disconnected, only one electric line R1 exists in the recovery power distribution system 150, and the currently existing electric line R1 supplies power to the coil L1 of the load side detection/recovery device 230, and as the coil L1 maintains a potential of 110V with the earth E connected to the second neutral point N2 of the load side detection/recovery device 230 and electromagnetically induces the coil L2 to recover the single-phase two-wire power in real-time. In case of a loose contact or a partial disconnection, the single-phase two-wire power is recovered in real-time for the same reason as described above.

In the same manner as the single-phase two-wire power, since the single-phase three-wire power is recovered in the same principle by using the neutral point instead of the earth E, detailed description of the single-phase three-wire power will be omitted. As a result, it is apparent that although a single-phase power line is configured as one line like the circuit shown in FIG. 4, it is possible to normally use the electricity.

In addition, if an electric leakage (grounding) occurs in a line R1 or R2 of the recovery power distribution system 150, leakage current flows only through the leaked circuit, and the leakage current is supplied by the recovery power of the load side detection/recovery device 230. Therefore, if the input and output lines of the load side detection/recovery device 230 are monitored through a zero current transformer or the earth E line connected to the N2 terminal of the load side detection/recovery device 230 is monitored through the zero current transformer, the leakage current can be detected. Alternatively, a method of detecting an electric leakage only by using voltage without connecting the N2 terminal of the load side detection/recovery device 230 to the earth is also possible.

Here, if voltage is detected without connecting the N2 terminal of the load side detection/recovery device 230 to the earth, the voltage can be detected at the N2 terminal and the earth E even in case of a disconnection, a loose contact or a partial disconnection, and thus leakage current is detected from the line R1 or R2. If voltage is detected from the N2 terminal and the earth E, the controller 220 determines it as an electric leakage (grounding) and issues a cutoff or a notification (alert). If voltage is detected from the N2 terminal and the earth E without detecting the leakage current from the line R1 or R2, it is determined as occurrence of a disconnection, a loose contact or a partial disconnection, and the controller 220 recovers power by connecting the N2 terminal and the earth E or performs a function of transferring an electrical signal so that a circuit breaker, an alert generator or a communication module may operate. (Here, if an electric leakage breaker is used on the power supply side, power may be immediately shut down although a controller, a trip coil or the like is not used.)

Figure 7:
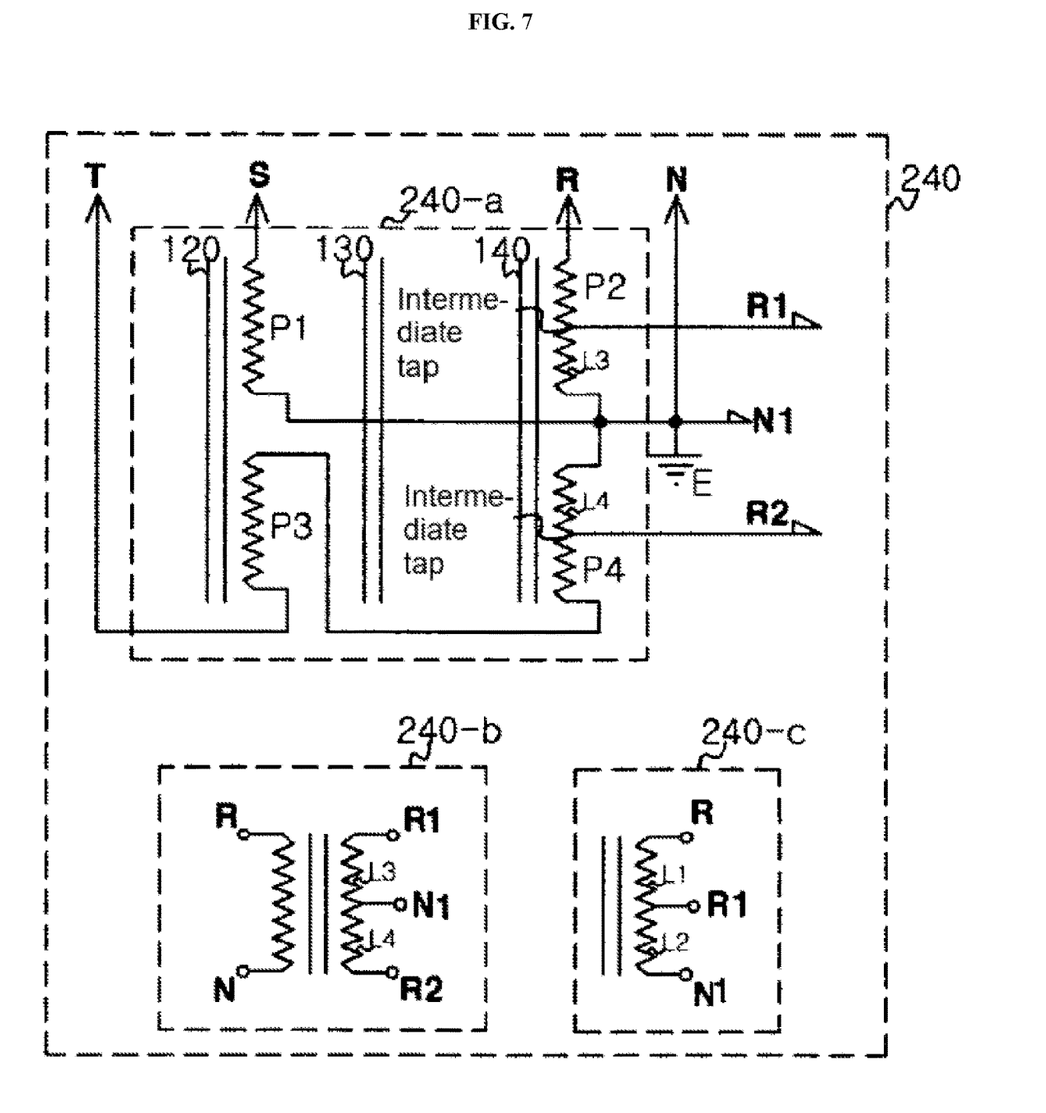
FIG. 7 is a view showing circuit diagrams of various embodiments of a power supply side detection/recovery device.

At this point, recovery of a disconnection and an open phase in the case of a three-phase four-wire power will be described with reference to FIGS. 6 to 8. In FIGS. 6 and 7, the power supply side detection/recovery device 240-a is provided with wires P1, P2, P3 and P4 and legs 120, 130 and 140 wound at a voltage ratio of 1:1, respectively, and an intermediate tap for outputting single-phase power and single-phase lines R1 and R2 of the recovery power distribution system 150 connected to the intermediate tap can be seen.

FIG. 7 is a view showing various embodiments of the power supply side detection/recovery device 240. 240-a shows a power supply side detection/recovery device used in the three-phase four-wire system of FIG. 6, 240-b is another embodiment of the power supply side detection/recovery device 240 of FIG. 3 formed in a structure for isolating the primary side and the secondary side, and 240-c shows another embodiment of the power supply side detection/recovery device 240 of FIG. 4.

Figure 8:
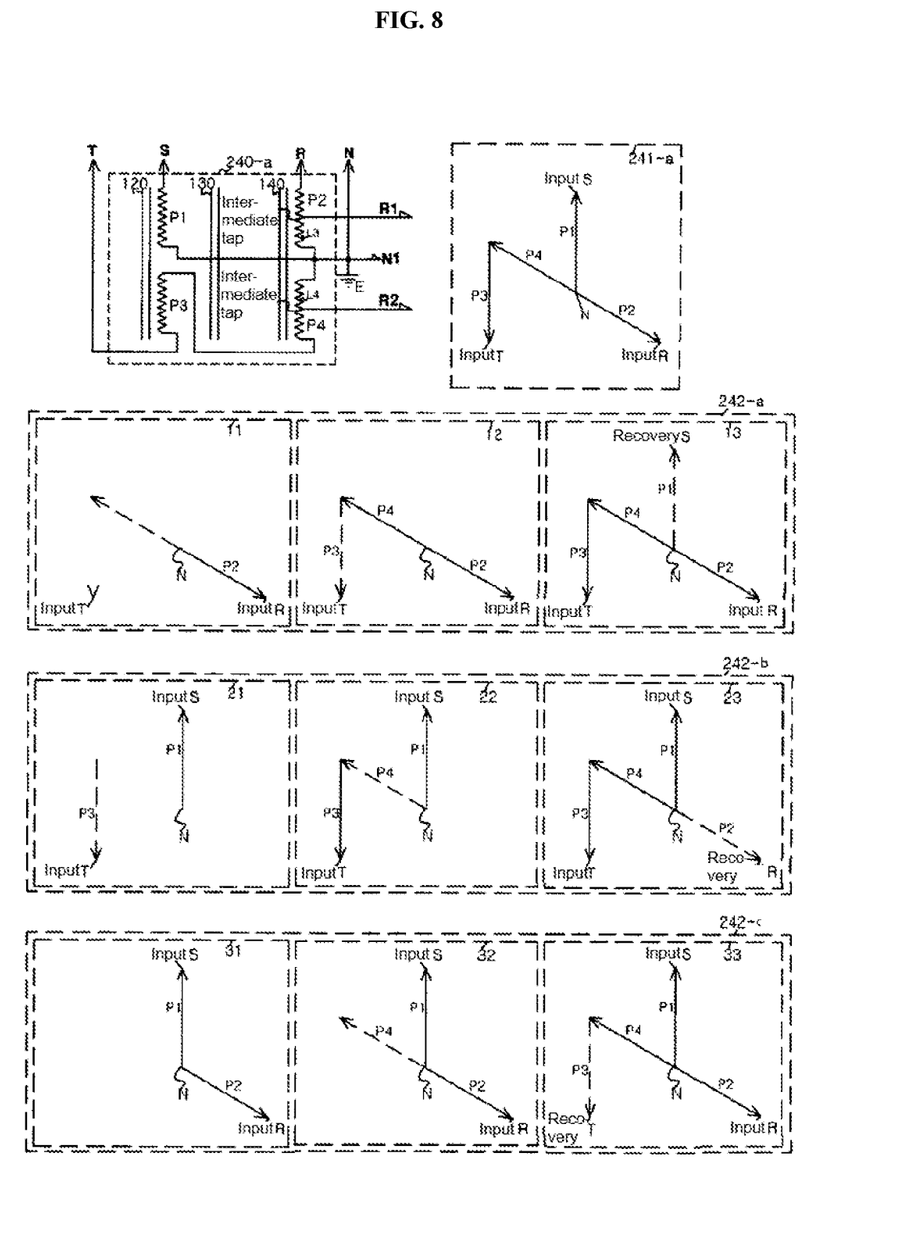
FIG. 8 shows vector diagrams describing a power recovery principle (sequence) in case of open phase in a three-phase four-wire power supply side detection/recovery device.

A vector diagram 241-a of a normal state of the power supply side detection/recovery device 240-a and recovery vector diagrams 242-a, 242-b and 242-c in case of a disconnection and an open phase are shown in FIG. 8. It will be described about recovery seeing FIG. 8. 11 of the vector diagram 242-a is a vector diagram of a state in which input S phase is disappeared. If input S phase is disappeared, power of the wire P1 disappears, and power is supplied only to input R phase, input T phase and the neutral line N, which maintain a phase angle of 120 degrees with each other. Therefore, voltage of input R phase is applied to the other end of wire P2, an end of which is connected to the neutral line N, and thus a phase voltage is generated through electromagnetic induction in a direction 180-degree opposite to the phase of a voltage induced at the wire P2 with respect to the neutral line N, at the wire P4 wound around a leg 140 that is the same as the third leg 140, on which wire P2 is wound, in a direction opposite to the direction of the wire P2, and therefore, a phase vector of a state 242-a (11) appears. Meanwhile, power is applied as input T phase having a phase difference of 120 degrees and a potential difference of 380V with input R phase and having a potential difference of 220V with the neutral line N is connected to an end of wire P3, and the voltage of a phase generated at the wire P4 applies a voltage of a direction opposite to the direction of input R phase having a phase difference with input T phase to the other end connected to the wire P3. As a result, a phase vector of a state 242-a (12) appears as a voltage having a phase the same as that of the disappeared input S phase is induced at the wire P3. In addition, since the wire P3 generates electromagnetic induction, which generates a voltage having a phase opposite to the phase of wire P3, at the wire P1 wound around the same leg 120, around which wire P3 is wound, in an opposite direction, input S phase is recovered as the wire P1, an end of which is connected to the neutral point N, generates the disappeared power input S phase of a phase 180-degree opposite to the phase of the wire P3 with respect to the neutral line.

In addition, if T phase is disconnected and disappeared as shown in the vector diagram 242-c (31) of FIG. 8, only the power of the input R phase, input S phase and the neutral line N is inputted into wires P1 and P2, and wire P2 electromagnetically induces wire P4 wound around the same leg 140 to induce a voltage at wire P4, and wire P3 is electromagnetically induced by the wire P1 wound around the leg 140 the same as that of the input S phase, and thus the T phase is recovered. In the same manner, if input R phase is disconnected and disappeared as shown in the vector diagram 242-b (21), a voltage of the same phase is induced at the wire P3 by the wire P1 of the input S phase, and a phase voltage of input S phase is induced at the electrical position of wire P3 connected to input T phase by the electrical position of input T phase with respect to the earth, and thus a potential difference of 220V with respect to the neutral line is generated at the wire P4, one end of which is connected to the wire P3, and a voltage is induced at the wire P4 by the potential difference, and thus a voltage is also generated at the wire P2 in the end, and input R shape is recovered to its original state.

In addition, as described above, a fault detector 210 is installed at the neutral point N2 of the load side detection/recovery device 230 to detect generation of an electrical failure such as a disconnection, an electric leakage, a loose contact or a partial disconnection. If an electrical failure is detected, the fault detector 210 may alert, cut off or transfer the electrical failure to the controller 220 to recover, remotely cut off, or notify the electrical failure to an external manager over a wired or wireless connection to provide an alert. Alternatively, it is possible to cut off or alert using only the fault detector 210 without the controller 220.

Describing in detail the cutoff or the alert carried out without the controller 220, when a disconnection, a loose contact or a partial disconnection occurs, voltage is generated at the neutral point N2 provided in the load side detection/recovery device 230 and the earth E. If a non-contact relay (SSR) implemented as the fault detector 210 detects the voltage generated at this point and begins to operate, the non-contact relay (SSR) may operate a trip coil using a switch provided therein to shut down the circuit breaker 270 or operate the alert generator 250 and recover the electrical failure by connecting the neutral point N2, which is provided in the load side detection/recovery device 230 to recover the electrical failure in real-time, to the earth E. In addition, if the current flowing through the neutral point N2 and the earth E is detected using the fault detector 210, recovery of the failure may be informed to the outside.

Here, the method of detecting a disconnection, a loose contact or a partial disconnection on the power supply side by the fault detector 210 may apply 1) detecting voltage or current of the earth E and the neutral point N2 generated when the disconnection, the loose contact or the partial disconnection is recovered, 2) detecting a current detection value of the single-phase two-wire electric line, determining as normal when the current detection value is R1+R2=0 and determining that an error has occurred in the recovery power distribution system 150 when the current detection value is detected as R1+R20, and 3) determining that an error has occurred in the recovery power distribution system 150 when it is determined in the single-phase three-wire electric line that the current generated when the fault is recovered is detected as R1+N2≠0 or R2+N2≠0. In the same manner, when an electric leakage occurs, 1) voltage or current of the earth E and the neutral point N2 may be detected, and 2) a current detection value of the single-phase two-wire electric line is detected, and it is determined as normal when the current detection value is R1+R2=0, and it is determined that an error has occurred when the current detection value is detected as R1+R2≠0. If it is determined that a fault has occurred, the fault detector 210 may issue an alert, shut down the circuit breaker 270, or transfer a detection value to the controller 220 so that the controller 220 may remotely send a signal for shutting down the circuit breaker or notify occurrence of the fault to a manager through a communication module over a wired or wireless connection.

Here, a relay, an earth leakage detector or the like provided with a microcomputer function may be used as the controller 220, or a communication facility installed in an existing facility may be used. However, in the present invention, it is preferable to implement the controller 220 as a microcomputer, a microprocessor, a central processing unit, a microcontroller or the like which can store a controllable program and control the overall operation of the real-time detection/recovery system in case of a power line failure in a power distribution system 200 according to the program.

Meanwhile, as is noted above, if it is determined that an abnormal voltage is generate or a current flows through the neutral point N2 due to a disconnection, a loose contact, a partial disconnection or an electric leakage in the power line, the controller 220 immediately operates the circuit breaker 270 or drives the alert generator 250. The alert generator 250 alerts a fault generated by the disconnection, the loose contact, the partial disconnection or the electric leakage, and in the present invention, the alert is issued in a method of visual alert and/or auditory alert. If a manager recognizes the alert while the visual and/or auditory alert is issued, the manager quickly takes a follow-up measure, and therefore, various electric accidents that can be generated by a disconnection, a loose contact, a partial disconnection or an electric leakage in the power line can be prevented.

The manager may cancel a generated alert as needed. For example, if the manager handles an alert canceling switch provided in an alert cancellation input unit 260, an alert cancellation signal is generated from the alert cancellation input unit 260 and transferred to the controller 220. If the alert cancellation signal is transferred, the controller 220 cancels the alert by stopping the operation of the alert generator 250.

In addition, in the present invention, the fault detector 210 detects occurrence of a disconnection, a loose contact, a partial disconnection or an electric leakage, transfers a high signal to the controller 220 when a disconnection, a loose contact, a partial disconnection or an electric leakage occurs, and transfers a low signal when it is normal. The controller 220 determines a fault by comparing a detection result with a preset value, and recovers the fault in real-time, issues an alert, cuts off the fault, notifies the fault over a wired or wireless connection to the manager as is scheduled previously, and thus electric accidents such as a power outage, an electric shock, a control interruption, burning damage of a device, a fire and the like that may occur by the disconnection, the loose contact, the partial disconnection or the electric leakage can be prevented.

In addition, as is noted above, the present invention continuously detects occurrence of a disconnection, a loose contact, a partial disconnection or an electric leakage through the fault detector 210 while the load side detection/recovery device 230 is operated by a disconnection, a loose contact or a partial disconnection and the fault is recovered. At this point, if an electric leakage, a loose contact or a partial disconnection is detected although the load side detection/recovery device 230 is operated by abnormal voltage or current at the power line or the neutral point, the controller 220 automatically operates the circuit breaker (MCCB, ELB, etc.), issues an alert, and wirelessly, or over a wired connection, notifies the fault using a control signal, and thus power outage, electric shock, burning damage of a load, and outbreak of a fire can be prevented.

For example, according to the present invention, accidents caused by an electrical failure can be prevented since occurrence of a power outage accident generated due to a disconnection can be prevented by automatically performing automatic recovery of power failure in case of a disconnection on the power supply side of a power distribution system, and short circuit, burning damage of an electric device, overheat and electric fire caused by tracking, spark or aging can be prevented by recovering in case of a loose contact or a partial disconnection, and electric shocks and electric fires caused by an electric leakage when the electric leakage occurs can be reduced.

In addition, as the controller 220 generates a circuit breaker operation control signal and operates a circuit breaker when recovery of power failure is failed, damage of devices on the rear side caused by overcurrent, abnormal voltage or the like can be prevented.

The real-time detection/recovery system 200 in case of a power line failure in a power distribution system of the present invention can be manufactured as a product by implementing the system as a module. Therefore, it may have profits of inspecting an electrical failure (an electric leakage, a disconnection, a loose contact or a partial disconnection on the single-phase power supply side), issuing an alert by installing the system in a panel board or a distribution panel, shutting down power in association with a circuit breaker in case of a power failure, alerting or shutting down abnormal power by easily applying the system to a previously installed power supplying device, or recovering the electrical failure in real-time.

The invention claimed is:

1. A real-time detection/recovery system of a power line failure in a power distribution system to prevent a power outage, an electric shock or a fire accident caused by a disconnection, a resistance increase, a loose contact, a partial disconnection or an electric leakage occurring on a power supply side of the power distribution system, the real-time detection/recovery system comprising at least one of a power supply side detection/recovery device and a load side detection/recovery device in the power distribution system, wherein:

the power supply side detection/recovery device performs at least one of recovery, cutoff, alert, notification and control in response to an open phase, a disconnection, a loose contact or a resistance increase in a power supply line of a single-phase or three-phase power supply by configuring a first neutral point in a middle of a power output coil and grounding the neutral point to Earth or detecting a potential difference between the first neutral point and Earth;

the load side detection/recovery device performs at least one of recovery, cutoff, alert, notification and control in response to an open phase, a disconnection, a loose contact or a resistance increase in the power supply line of the single-phase or three-phase power supply by configuring a second neutral point in the middle of the power output coil and grounding the second neutral point to Earth, connecting the second neutral point to the first neutral point or detecting a potential difference between the second neutral point and Earth;

wherein the load side detection/recovery device is configured to prevent a short circuit accident caused by a line, to reduce the electric leakage, to reduce a line failure, to simplify a line maintenance, and to reduce a construction cost by grounding the second neutral point of the load side detection/recovery device to Earth and configuring single-phase power supply lines as one line;

wherein in response to an electrical failure due to an occurrence of a disconnection, a resistance increase, a loose contact, a partial disconnection, an electric leakage or grounding on the power supply side of the load side detection/recovery device, the second neutral point of the load side detection/recovery device or a power line (R, S or T) generates and transfers an electrical signal to a fault detector; and wherein the power supply side detection/recovery device and the load side detection/recovery device perform at least one of recovery, cutoff, alert, notification and control in response to an open phase, a disconnection, a loose contact or a resistance increase in the power supply line of the single-phase or three-phase power supply by respectively configuring the first and second neutral points using an element electrically/electronically connected to the single-phase or three-phase power supply and respectively grounding the first and second neutral points to Earth or detecting the potential difference between the first neutral point and Earth and between the second neutral point and Earth, respectively.

2. The system according to claim 1, wherein the element is at least one of an inductor, a resistor, a capacitor, a varistor, a silicon or germanium, a carbon, a coil, and an integrated circuit.

3. The system according to claim 1, wherein the fault detector is configured to detect an electrical signal generated in response to a fault in the power line or the second neutral point provided in input and output lines of the load side detection/recovery device, and in response to a determination that the fault is a disconnection, a loose contact, a partial disconnection, an electric leakage or grounding, the fault detector is configured to issue an alert to cut off the fault through a circuit breaker via an alert generator or to recover the fault in real-time through the load side detection/recovery device.

4. The system according to claim 1, wherein the fault detector comprises an electronic relay, a solid state relay (SSR), a zero current transformer, a voltage detector, a current detector or a relay to detect the electrical signal outputted in response to the fault in the second neutral point or the power line.

5. The system according to claim 1, wherein the power supply side detection/recovery device is configured to prevent an occurrence of the electric shock or the fire accident caused by the electric leakage by configuring the first neutral point, grounding the first neutral point to Earth, and maintaining a potential difference between the power supply line and Earth to be constant.

6. The system according to claim 1, wherein the power supply side detection/recovery device is connected to the power distribution system having a single-phase three-wire or a three-phase four-wire load line to prevent an inflow of an unbalanced overvoltage when a neutral line is disconnected in the power distribution system and to prevent an occurrence of overheat and fire from the unbalanced overvoltage.

7. A real-time detection/recovery system of a power line failure in a power distribution system to prevent a power outage, an electric shock or a fire accident caused by a disconnection, a resistance increase, a loose contact, a partial disconnection or an electric leakage occurring on a power supply side of the power distribution system, the real-time detection/recovery system comprising:

a power supply side detection/recovery device connected on a power supply side and a load side detection/recovery device connected on a load side;

wherein the power supply side detection/recovery device comprises a first leg, a second leg and a third leg; and a first wire, a second wire and a third wire;

wherein the first wire is wound around the first leg, the second wire is wound around the third leg, and the third wire is wound around the first leg and the third leg in a zigzag form in a direction opposite to a direction of windings of the first wire and the second wire;

wherein one ends of the first wire, the second wire and the third wire are connected to a neutral line, and a power is supplied from the first wire, the second wire or the third wire connected to the neutral line to the load side detection/recovery device to recover a failed power supply in response to a disconnection on a power supply side of the power supply side detection/recovery device or a disconnection on a power supply side of the load side detection/recovery device.

8. The system according to claim 7, wherein the power supply side detection/recovery device comprises a primary coil to prevent outage of a single-phase power by recovering an electrical failure in real-time and supplying the single-phase power although an R phase, an S phase, a T phase or the neutral line N is disconnected or open-phased on the power supply side of the power distribution system, and to prevent an electric shock or outbreak of a fire caused by the electric leakage or grounding by reducing a ground potential difference of the single-phase power.

9. The system according to claim 7, wherein the load side detection/recovery device is configured to prevent a short circuit accident caused by a line, to reduce the electric leakage, to reduce a line failure, to simplify a line maintenance, and to reduce a construction cost by grounding a neutral point of the load side detection/recovery device to Earth and configuring single-phase power supply lines as one line.

10. The system according to claim 7, wherein in response to an electrical failure due to an occurrence of a disconnection, a resistance increase, a loose contact, a partial disconnection, an electric leakage or grounding on the power supply side of the load side detection/recovery device, a neutral point of the load side detection/recovery device or a power line (R, S or T) generates and transfers an electrical signal to a fault detector.

11. The system according to claim 7, wherein the power supply side detection/recovery device and the load side detection/recovery device perform at least one of recovery, cutoff, alert, notification and control in response to an open phase, a disconnection, a loose contact or a resistance increase in the power supply line of the single-phase or three-phase power supply by configuring a neutral point using an element electrically/electronically connected to the single-phase or three-phase power supply and grounding the neutral point to Earth or detecting a potential difference between the neutral point and Earth.

12. The system according to claim 11, wherein the element is at least one of an inductor, a resistor, a capacitor, a varistor, a silicon or germanium, a carbon, a coil, and an integrated circuit.

13. The system according to claim 10, wherein the fault detector is configured to detect an electrical signal generated in response to a fault in the power line or the second neutral point provided in input and output lines of the load side detection/recovery device, and in response to a determination that the fault is a disconnection, a loose contact, a partial disconnection, an electric leakage or grounding, the fault detector is configured to issue an alert to cut off the fault through a circuit breaker via an alert generator or to recover the fault in real-time through the load side detection/recovery device.

14. The system according to claim 10, wherein the fault detector comprises an electronic relay, a solid state relay (SSR), a zero current transformer, a voltage detector, a current detector or a relay to detect the electrical signal outputted in response to the fault in the neutral point or the power line.

15. The system according to claim 7, wherein the power supply side detection/recovery device is configured to prevent an occurrence of the electric shock or the fire accident caused by the electric leakage by configuring a neutral point in the middle of a coil supplied with power from the power supply side detection/recovery device, grounding the neutral point to Earth, and maintaining a potential difference between the power supply line and Earth to be constant.

16. The system according to claim 7, wherein the power supply side detection/recovery device is connected to the power distribution system having a single-phase three-wire or a three-phase four-wire load line to prevent an inflow of an unbalanced overvoltage when the neutral line is disconnected in the power distribution system and to prevent an occurrence of overheat and fire from the unbalanced overvoltage.

17. The system according to claim 7, wherein the power supply side detection/recovery device is connected to a three-phase three-wire or three-phase four-wire power distribution system to prevent outage of a single-phase power caused by the electrical failure by recovering a three-phase power in real-time and supplying the single-phase power to the load side without the power outage in response to a fuse disconnection of a phase, a damage and disconnection of a line, a failure of a transformer, a burning damage of equipment and materials, an open phase, and a disconnection of the neutral line on the power supply side.

* * * * *